(12) United States Patent
Chen et al.

(10) Patent No.: US 12,148,657 B2
(45) Date of Patent: *Nov. 19, 2024

(54) SEMICONDUCTOR STRUCTURE AND METHOD FOR FORMING THE SAME

(71) Applicant: Taiwan Semiconductor Manufacturing Company, Ltd., Hsinchu (TW)

(72) Inventors: Chien-Han Chen, Hsinchu (TW); Shih-Yu Chang, Hsinchu (TW); Chien-Chih Chiu, Xinying (TW); Yi-Tang Chen, Hsinchu (TW); Da-Wei Lin, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/190,328

(22) Filed: Mar. 27, 2023

(65) Prior Publication Data
US 2024/0332069 A1    Oct. 3, 2024

Related U.S. Application Data

(63) Continuation of application No. 17/166,539, filed on Feb. 3, 2021, now Pat. No. 11,615,983.

(Continued)

(51) Int. Cl.
*H01L 21/768* (2006.01)
*H01L 23/522* (2006.01)
*H01L 23/532* (2006.01)

(52) U.S. Cl.
CPC .. *H01L 21/76832* (2013.01); *H01L 21/76816* (2013.01); *H01L 21/76877* (2013.01); *H01L 23/5226* (2013.01); *H01L 23/53238* (2013.01)

(58) Field of Classification Search
CPC ......... H01L 21/76831; H01L 21/76802; H01L 21/76877; H01L 23/5226; H01L 23/528; H01L 21/76832; H01L 21/7681
See application file for complete search history.

(56) References Cited

U.S. PATENT DOCUMENTS 6,100,184 A * 8/2000 Zhao ................. H01L 21/76843
 438/653
2016/0111325 A1   4/2016 Jangjian et al.
(Continued)

FOREIGN PATENT DOCUMENTS

TW        201731021 A       9/2017

OTHER PUBLICATIONS

Non-Final Office Action on U.S. Appl. No. 17/166,539 dated Aug. 12, 2022.

(Continued)

*Primary Examiner* — Karen Kusumakar
(74) *Attorney, Agent, or Firm* — FOLEY & LARDNER LLP

(57) ABSTRACT

A semiconductor interconnect structure includes a conductive line electrically coupled to an active semiconductor device, a first etch stop layer formed over the conductive line, a first dielectric layer formed over the first etch stop layer, a second etch stop layer formed over the first dielectric layer, a second dielectric layer formed over the second etch stop layer, and an interconnect structure electrically coupled to the via and extending through the first etch stop layer, the first dielectric layer, the second etch stop layer, and the second dielectric layer. The interconnect structure includes a via extending through the first etch stop layer, the second etch stop layer, and the first dielectric layer and a trench extending through the second dielectric layer.

20 Claims, 20 Drawing Sheets

Related U.S. Application Data

(60) Provisional application No. 63/013,937, filed on Apr. 22, 2020.

(56) References Cited

U.S. PATENT DOCUMENTS

| | | |
|---|---|---|
| 2018/0005876 A1 | 1/2018 | Tung et al. |
| 2019/0035734 A1* | 1/2019 | Ho .................. H01L 23/528 |
| 2019/0229062 A1 | 7/2019 | Shin et al. |
| 2020/0083094 A1 | 3/2020 | Ding et al. |

OTHER PUBLICATIONS

Notice of Allowance on U.S. Appl. No. 17/166,539 dated Nov. 28, 2022.
Taiwan Office Action on TW Appl. Ser. No. 110114331 dated Oct. 22, 2021 (5 pages).
Office Action issued in connection with Chinese Appl. No. 202110436335.8 dated Aug. 28, 2024.

\* cited by examiner

SEMICONDUCTOR STRUCTURE AND METHOD FOR FORMING THE SAME

CROSS-REFERENCE TO RELATED PATENT APPLICATIONS

This application is a continuation of U.S. application Ser. No. 17/166,539, filed Feb. 3, 2021, which claims the benefit of and priority to U.S. Provisional Patent Application No. 63/013,937 filed Apr. 22, 2020, the entire contents of which are incorporated herein by reference for all purposes.

BACKGROUND

The present disclosure generally relates to semiconductor devices and methods for fabricating semiconductor devices, and particularly to interconnect structures formed during the integrated circuit fabrication process. Semiconductor devices are used in a wide variety of electronics, and improvements regarding both production and performance of semiconductor devices are generally desired. As the size of these devices continues to decrease, challenges in creating high performance and feasible interconnect structures can arise.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
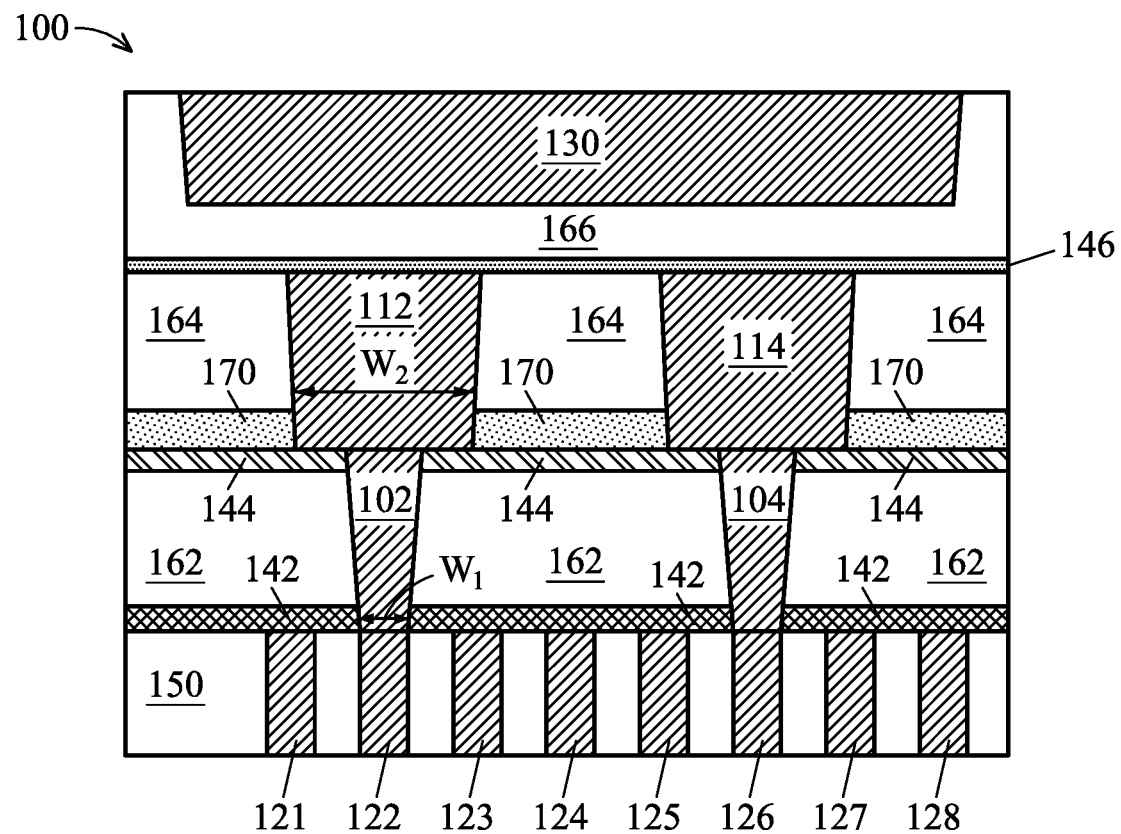
FIG. 1 illustrates a cross section of an example interconnect structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides an interconnect structure for facilitating electrical connections with semiconductor devices in an integrated circuit. The interconnect structure includes an added etch stop layer formed around a junction of a via and a trench of the interconnect structure. The added etch stop layer serves as a hard mask that can be patterned before removing significant portions of dielectric material for filling with conductive material. The interconnect structure can provide improvements in terms of via faceting control, especially when used with semiconductor devices having continually smaller critical dimension sizes. As critical dimension sizes continue to decrease, challenges including loss of mask material, constrained process windows, and inconsistencies in via profiles may arise.

Referring now to FIG. 1, a cross section of an example interconnect structure 100 is shown, in accordance with some embodiments. Interconnect structure 100 can generally be formed during the back end of line (BEOL) portion of an integrated circuit fabrication process. Interconnect structure 100 generally facilitates electrical connection between individual semiconductor devices (e.g. transistors, etc.) and wiring formed within the integrated circuit.

Interconnect structure 100 is shown to include an inter-layer dielectric (ILD) 150 and a plurality of conductive lines, including a conductive line 121, a conductive line 122, a conductive line 123, a conductive line 124, a conductive line 125, a conductive line 126, a conductive line 127, and a conductive line 128. Inter-layer dielectric 150 can be formed using a dielectric material with a low dielectric constant (low-k dielectric) such as tetraethyl orthosilicate, silicon dioxide, or other suitable materials. Inter-layer dielectric 150 generally provides electrical isolation of the closely-spaced conductive line 121, conductive line 122, conductive line 123, conductive line 124, conductive line 125, conductive line 126, conductive line 127, and conductive line 128. The use of low-k dielectric material to form inter-layer dielectric 150 allows inter-layer dielectric 150 to provide this electrical isolation while minimizing capacitive coupling (cross talk) between conductive line 121, conductive line 122, conductive line 123, conductive line 124, conductive line 125, conductive line 126, conductive line 127, and conductive line 128. Each of conductive line 121, conductive line 122, conductive line 123, conductive line 124, conductive line 125, conductive line 126, conductive line 127, and conductive line 128 are can be connected to one or more active devices (e.g. transistors, etc.) formed during the front end of line (FEOL) portion of the integrated circuit fabrication process. For example, conductive line 121, conductive line 122, conductive line 123, conductive line 124, conductive line 125, conductive line 126, conductive line 127, and conductive line 128 can be connected to a conductive contact electrically coupled to a gate of a transistor.

Interconnect structure 100 is also shown to include a via 102 and a trench 112. Via 102 is generally a via structure that is electrically connected to conductive line 122 as well as trench 112. Trench 112 is generally a conductive trench such as a copper interconnect. Via 102 and trench 112 can be formed using various suitable conductive materials and combinations thereof, such as copper, aluminum, and other conductive materials. In FIG. 1, the variable $W_1$ denotes the width of via 102, and the variable $W_2$ denotes the width of trench 112. In some embodiments, the width $W_1$ ranges from 5 nanometers to 15 nanometers, however widths outside of this range are also contemplated. In some embodiments, the width $W_2$ ranges from 15 nanometers to 20 nanometers, however widths outside of this range are also contemplated. Via 102 and trench 112 can be formed using various suitable processes, such as a dual damascene process. More detail regarding the fabrication process for forming via 102 and trench 112 is provided below.

Interconnect structure 100 is also shown to include a via 104 and a trench 114. Via 104 is generally a via structure that is electrically connected to conductive line 126 as well as trench 114. Trench 114 is generally a conductive trench such as a copper interconnect. Via 104 and trench 114 can be formed using various suitable conductive materials and combinations thereof, such as copper, aluminum, and other conductive materials. Similar to via 102, in some embodiments, the width of via 104 ranges from 5 nanometers to 15 nanometers, however widths outside of this range are also contemplated. Also, similar to via 104, in some embodiments, the width of trench 114 ranges from 15 nanometers to 20 nanometers, however widths outside of this range are also contemplated. Via 104 and trench 114 can be formed using various suitable processes, such as a dual damascene process. More detail regarding the fabrication process for forming via 104 and trench 114 is provided below.

Interconnect structure 100 is also shown to include a first etch stop layer (ESL) 142, a second etch stop layer 144, and a third etch stop layer 146. The first etch stop layer 142, the second etch stop layer 144, and the third etch stop layer 146 generally provide a layer of material with different etch characteristics than surrounding materials such as inter-metal dielectric 162, inter-metal dielectric 164, and inter-metal dielectric 166 as well as insulating layer 170. Because the first etch stop layer 142, the second etch stop layer 144, and the third etch stop layer 146 have different etch characteristics (e.g. different etch selectivity) than surrounding materials, improvements in various etching processes used in the fabrication of interconnect structure 100 can be attained. The first etch stop layer 142, the second etch stop layer 144, and the third etch stop layer 146 can be formed using materials such as silicon nitride, silicon oxide, silicon carbide, and other suitable materials and combinations thereof. In some embodiments, the first etch stop layer 142, the second etch stop layer 144, and the third etch stop layer 146 are formed using aluminum oxide, and each of the first etch stop layer 142, the second etch stop layer 144, and the third etch stop layer 146 range in thickness form 10 angstroms to 30 angstroms, however thicknesses outside of this range are also contemplated. The use of the second etch stop layer 144 in particular can facilitate improvements in faceting control of both via 102 and via 104, as it can serve as a hard mask during the patterning of via 102 and via 104.

Interconnect structure 100 is also shown to include an inter-metal dielectric (IMD) 162, an inter-metal dielectric 164, and an inter-metal dielectric 166. Various materials and combinations of materials can be used to form inter-metal dielectric 162, inter-metal dielectric 164, and inter-metal dielectric 166, such as materials with an extra low dielectric constant (extra-low-k, or ELK) including oxides, nitrides, and other suitable materials. Inter-metal dielectric 162 is formed between the first etch stop layer 142 and the second etch stop layer 144. Inter-metal dielectric 164 is formed between insulating layer 170 and third etch stop layer 146. Inter-metal dielectric 166 is formed above the third etch stop layer 146 and at least partially around conductive filling 130.

Interconnect structure 100 is also shown to include an insulating layer 170. Insulating layer can be formed using various suitable materials, such as dielectric materials with a low dielectric constant (low-k) or dielectric materials with a high dielectric constant (high-k), among other suitable materials and combinations thereof. For example, insulating layer can be formed using silicon oxide, silicon nitride, and other suitable materials. In some embodiments, insulating layer 170 is formed using silicon oxide and has a thickness ranging from 120 angstroms to 180 angstroms, however thicknesses outside of this range are also contemplated. Interconnect structure 100 is also shown to include a conductive filling 130 formed over inter-metal dielectric 166 that can be used to provide an electrical connection to different layers of the integrated circuit.

It will be appreciated that interconnect structure 100 can be implemented using additional layers and materials beyond what is expressly illustrated in FIG. 1. For example, various different barrier metal layers, seed layers, conductive layers, dielectric layers, and other types of layer and materials suitable for use in an integrated circuit may be implemented in interconnect structure 100 depending on the intended application. The illustration provided in FIG. 1 is intended to be an example implementation, and the skilled person will recognize that various suitable adaptations to this implementation are contemplated within the scope of the present disclosure.

Figure 2:
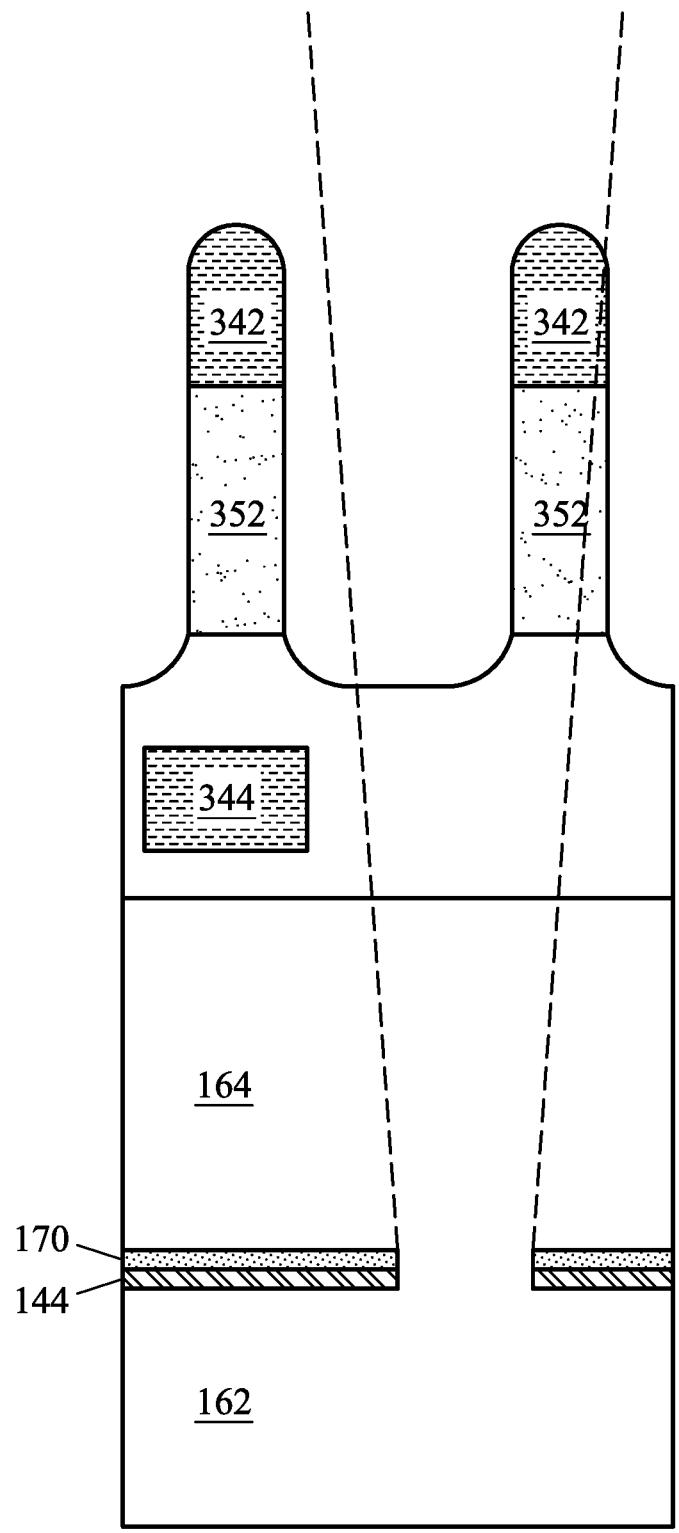
FIG. 2 illustrates another cross section of the example interconnect structure of FIG. 1, in accordance with some embodiments.

Referring now to FIG. 2, another cross section of interconnect structure 100 is shown, in accordance with some embodiments. FIG. 2 provides an illustration of the opening (e.g. opening 602 discussed below) formed into insulating layer 170 and the second etch stop layer 144 for via 102 that has occurred before patterning inter-metal dielectric 162 and inter-metal dielectric 164 to fill with conductive material. More detail regarding this process is discussed below. The second etch stop layer 144 can protect the angle of via 102 because via 102 will not be constrained by the patterning of inter-metal dielectric 162 and inter-metal dielectric 164. Also shown in FIG. 2 is a mask layer 352 that is disposed between a buffer layer 342 and a buffer layer 344. In some embodiments, mask layer 352 is a hard mask formed using titanium nitride and buffer layer 342 and buffer layer 344 are formed using tetraethyl orthosilicate, however other suitable materials and combinations thereof can be used to form mask layer 352, buffer layer 342, and buffer layer 344. FIG. 2 illustrates that mask layer 352 (as well as buffer layer 342 and buffer layer 344) may be protected due to the fact that the opening formed into insulating layer 170 and the second etch stop layer 144 for via 102 has occurred before forming an opening in inter-metal dielectric 162 and inter-metal dielectric 164 to fill with conductive material.

Figure 3A:
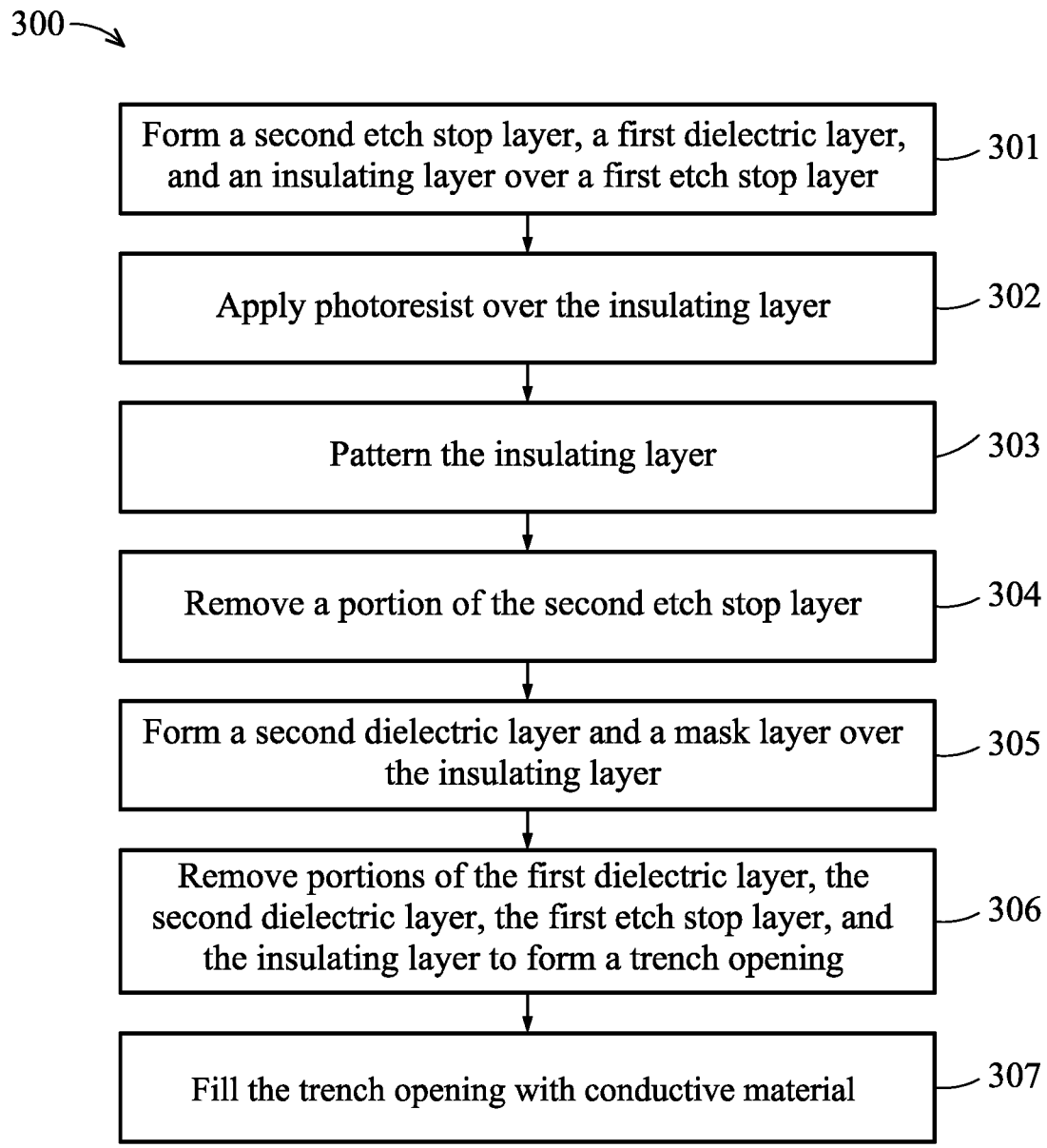
FIG. 3A is a flow diagram illustrating an example process for fabricating the interconnect structure of FIG. 1, in accordance with some embodiments.

FIG. 3A is a flow diagram illustrating an example process 300 for fabricating interconnect structure 100. FIGS. 3B-3H illustrate cross sections of interconnect structure 100 at each act of process 300. In general, process 300 includes formation of openings for via 102 and via 104 that are patterned into the second etch stop layer 144 before forming the openings for filling with the conductive material that ultimately forms via 102 and via 104, along with trench 112 and trench 114.

Figure 3B:
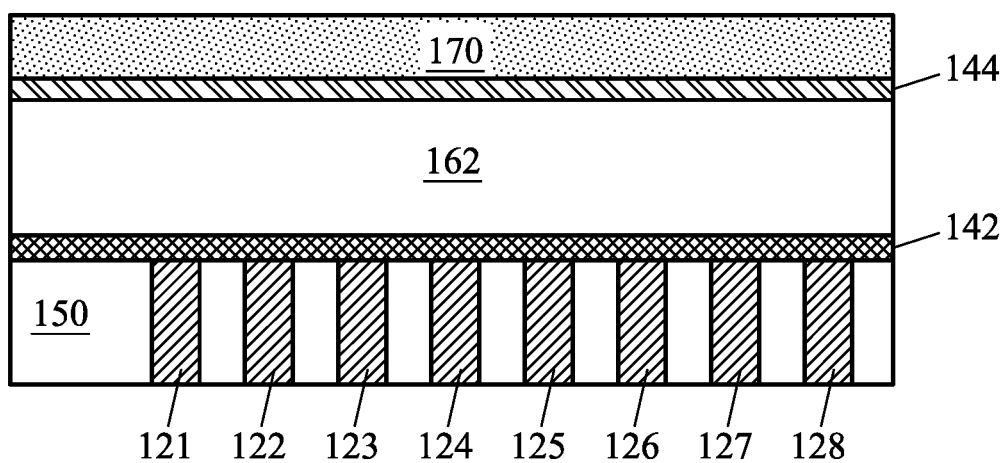
FIGS. 3B-3H illustrate cross sections of the interconnect structure of FIG. 1 at various acts of the process of FIG. 3A, in accordance with some embodiments.

At an act 301, a first dielectric layer, a second etch stop layer, and an insulating layer are formed over a first etch stop layer (FIG. 3B). As illustrated in FIG. 3B, inter-metal dielectric 162 is formed over the first etch stop layer 142, the second etch stop layer 144 is formed over inter-metal dielectric 162, and insulating layer 170 is formed over the second etch stop layer 144. Inter-metal dielectric 162 can be formed over the first etch stop layer 142 using various suitable processes, including chemical vapor deposition (CVD), physical vapor deposition (PVD), atomic layer deposition (ALD), and other suitable processes and combinations thereof. The second etch stop layer 144 can be formed over inter-metal dielectric 162 using various suitable processes, likewise including chemical vapor deposition, physical vapor deposition, atomic layer deposition, and other suitable processes and combinations thereof. Insulating layer 170 can be formed over the second etch stop layer 144 using various suitable processes, also including chemical vapor deposition, physical vapor deposition, atomic layer deposition, and other suitable processes and combinations thereof.

Figure 3C:
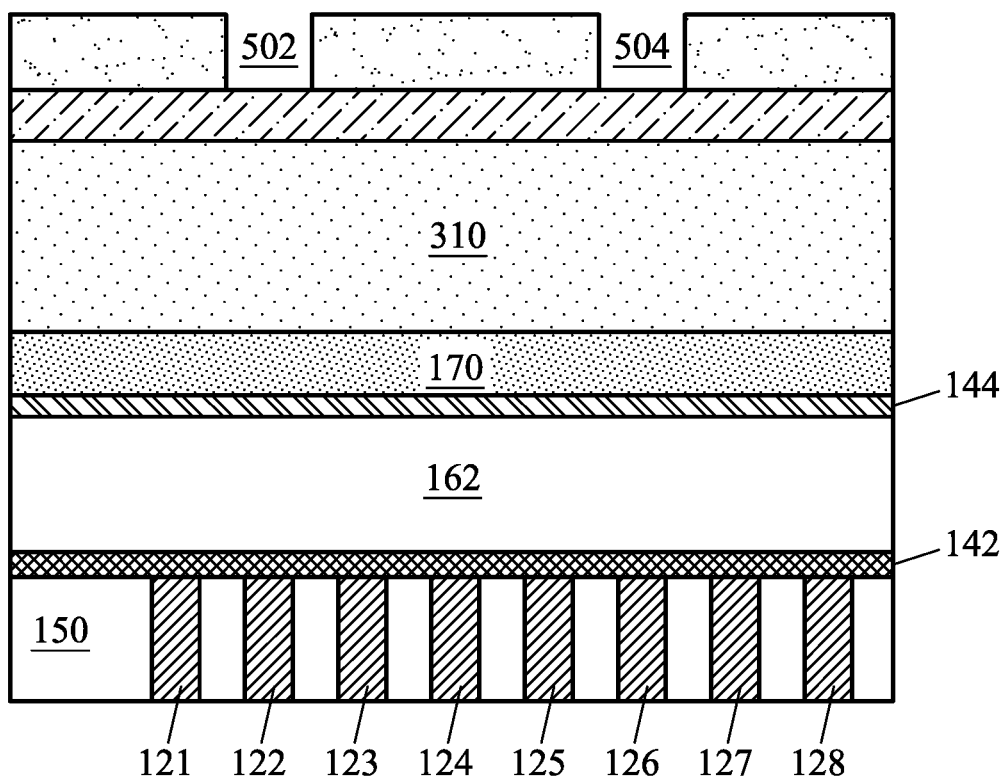

At an act 302, a photoresist is applied over the insulating layer (FIG. 3C). As illustrated in FIG. 3C, a photoresist 310 is applied over insulating layer 170. Also shown in FIG. 3C, both an opening 502 and an opening 504 are formed over photoresist 310. Before applying photoresist 310 in act 302, various protective layers can be applied in insulating layer 170, such as a bottom anti-reflective coating (BARC) layer. Polishing acts and other preparation acts may also be performed. Photoresist 310 can be applied over insulating layer 170 using various suitable processes, including spin coating and other suitable processes and combinations thereof. Opening 502 and opening 504 can then be aligned with a photomask such that exposure to ultraviolet light during a photolithography process ultimately facilitates formation of via openings in insulating layer 170 in strategic locations for placement of via 102 and via 104, respectively, as discussed further below.

Figure 3D:
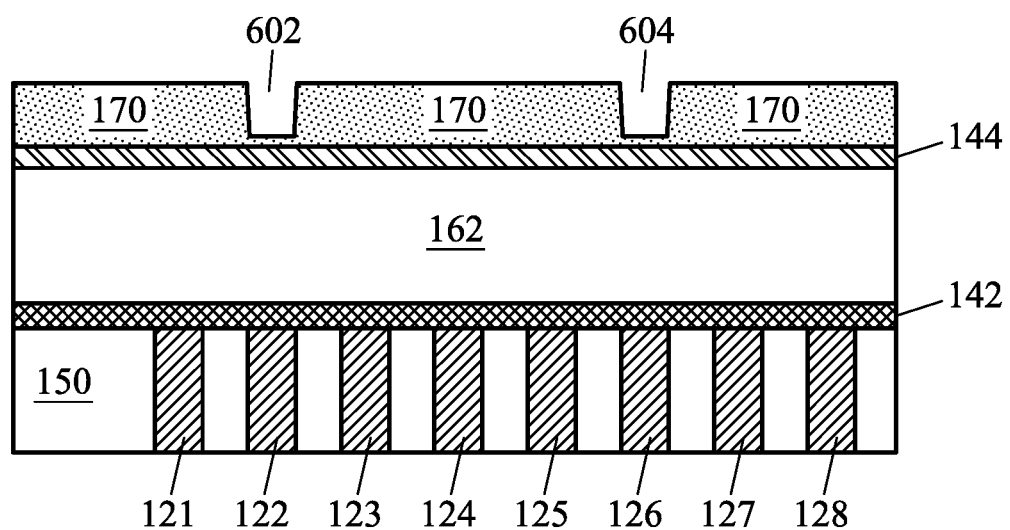

At an act 303, the insulating layer is patterned (FIG. 3D). As illustrated in FIG. 3D, insulating layer 170 is patterned to form both an opening 602 and an opening 604. Opening 602 is formed in accordance with the photolithography performed in act 302 with respect to opening 502. In act 303, opening 602 is patterned in accordance with a desired profile for via 102. Similarly, in act 303, opening 604 is patterned in accordance with a desired profile for via 104. The patterning in act 303 can be performed using various suitable processes, including both dry etching and wet etching processes. The second etch stop layer 144 can help facilitate the patterning of insulating layer 170 in act 303. For example, portions of insulating layer 170 can be removed down to the second etch stop layer 144 (or close to the second etch stop layer 144) in act 303. Depending on the intended application, the patterning performed in act 303 can be adapted to accommodate different profiles.

In act 303, various etchants can be used to pattern insulating layer 170, including fluorocarbon-based etchants ($C_xF_y$) used at a flow rate ranging from 20 standard cubic centimeters per minute to 50 standard cubic centimeters per minute, nitrogen-based ($N_2$) etchants used at a flow rate ranging from 0 standard cubic centimeters per minute to 100 standard cubic centimeters per minute, oxygen based ($O_2$) etchants used at a flow rate ranging from 0 standard cubic centimeters per minute to 25 standard cubic centimeters per minute, argon-based (Ar) etchants used at a flow rate ranging from 600 standard cubic centimeters per minute to 1,200 standard cubic centimeters per minute, hydrogen-based ($H_2$) etchants used at a flow rate ranging from 0 standard cubic centimeters per minute to 100 standard cubic centimeters per minute, and hydrofluorocarbon-based etchants ($CH_xF_y$) used at a flow rate ranging from 0 standard cubic centimeters per minute to 100 standard cubic centimeters per minute. Parameters used in the patterning process can include a either a high radio frequency with a source power ranging from 200 watts to 1000 watts or a low radio frequency with source power ranging from 200 watts to 500 watts. Parameters used in the patterning process can also include a temperature ranging from 0 degrees Celsius to 50 degrees Celsius, a pressure of 20 millitorr to 80 millitorr, a DCS voltage of 0 volts to 500 volts, and a line center and edge trench depth bias of less than 20 angstroms. However, other etchants as well as flow rates, source powers, pressures, temperatures, voltages, and biases outside of the ranges specified above are also contemplated.

Figure 3E:
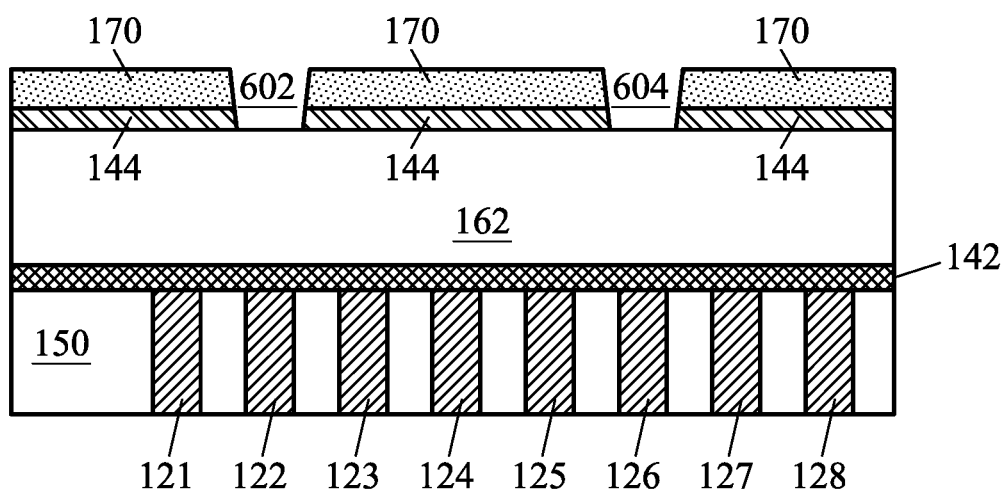

At an act 304, a portion of the second etch stop layer is removed (FIG. 3E). As illustrated in FIG. 3E, both a first portion of the second etch stop layer 144 is removed in accordance with a desired profile for via 102 and a second portion of the second etch stop layer 144 is removed in accordance with a desired profile for via 104. The portion of the second etch stop layer 144 can be removed using various suitable processes, including both wet etching and dry etching processes. In act 304, opening 602 is extended through the second etch stop layer 144 to form an opening for forming via 102, and opening 604 is also extended through the second etch stop layer 144. The extension of opening 602 and opening 604 through the second etch stop layer 144 in act 304, which notably occurs before opening of trench 802 and trench 804 as discussed below, can provide improvements in terms of via faceting integrity, especially as critical dimension sizes in semiconductor devices and integrated circuits continues to decrease.

Figure 3F:
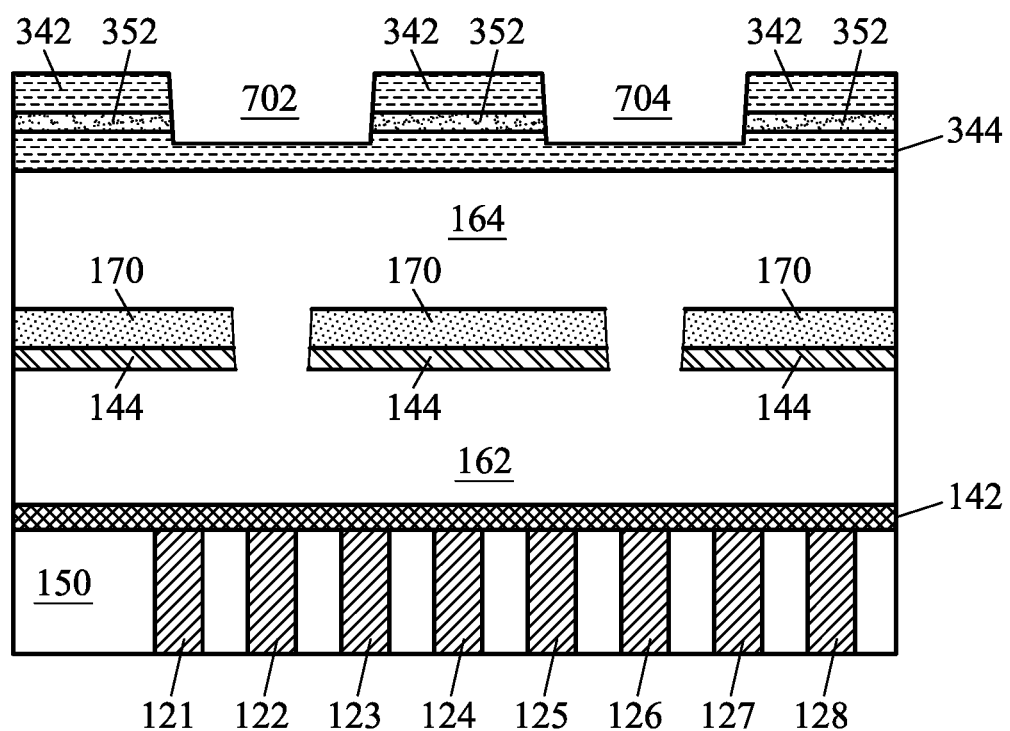

At an act 305, a second dielectric layer and a mask layer are formed over the insulating layer (FIG. 3F). As illustrated in FIG. 3F, inter-metal dielectric 164 is formed over insulating layer 170 and within opening 602 and opening 604. Additionally, mask layer 352 is formed over inter-metal dielectric 164 and between buffer layer 342 and buffer layer 344. Mask layer 352 is patterned such that both an opening 702 and an opening 704 are formed within mask layer 352. Opening 702 and opening 704 are formed above opening 602 and opening 604, respectively. Mask layer 352 serves as an etching mask during act 306, discusses below, to facilitate formation of trenches that ultimately are filled to form via 102, trench 112, via 104, and trench 114. Mask layer 352 in addition to inter-metal dielectric 164, buffer layer 342, and buffer layer 344 can be formed over insulating layer 170 using a variety of suitable processes, including chemical vapor deposition, physical vapor deposition, atomic layer deposition, and other suitable processes and combinations thereof.

Figure 3G:
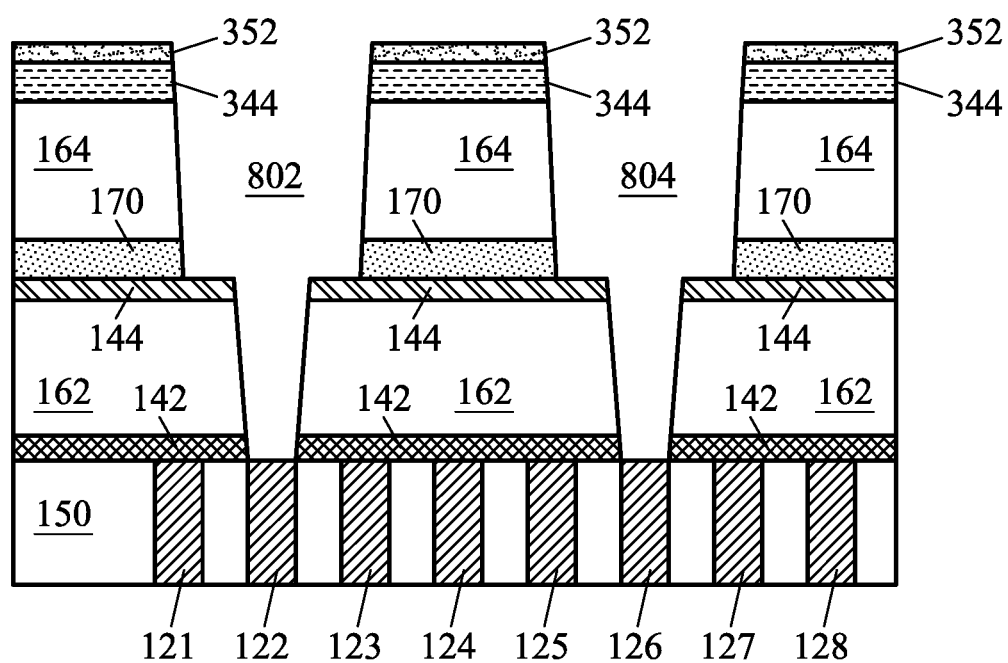

At an act 306, portions of the first dielectric layer, the second dielectric layer, the first etch stop layer, and the insulating layer are removed to form an opening (FIG. 3G). As illustrated in FIG. 3G, portions of inter-metal dielectric 162, inter-metal dielectric 164, the first etch stop layer 142, and insulating layer 170 are removed to form both a first opening 802 and a second opening 804. Removing the portion of the first etch stop layer 142 as illustrated in FIG. 4I provides access to conductive line 122. Both the first opening 802 and the second opening 804 can be created using a variety of suitable removal processes and combinations thereof, including various linear removal processes, wet etching processes, dry etching processes, and the like. Because the first opening 802 and the second opening 804 are created after the via profile is formed in act 304, improvements in terms of via faceting integrity can be achieved since the profiles of opening 602 and opening 604 are not subject to variability in the removal of the portions of inter-metal dielectric 164 in act 306. In act 306, buffer layer 342 can also be removed.

Figure 3H:
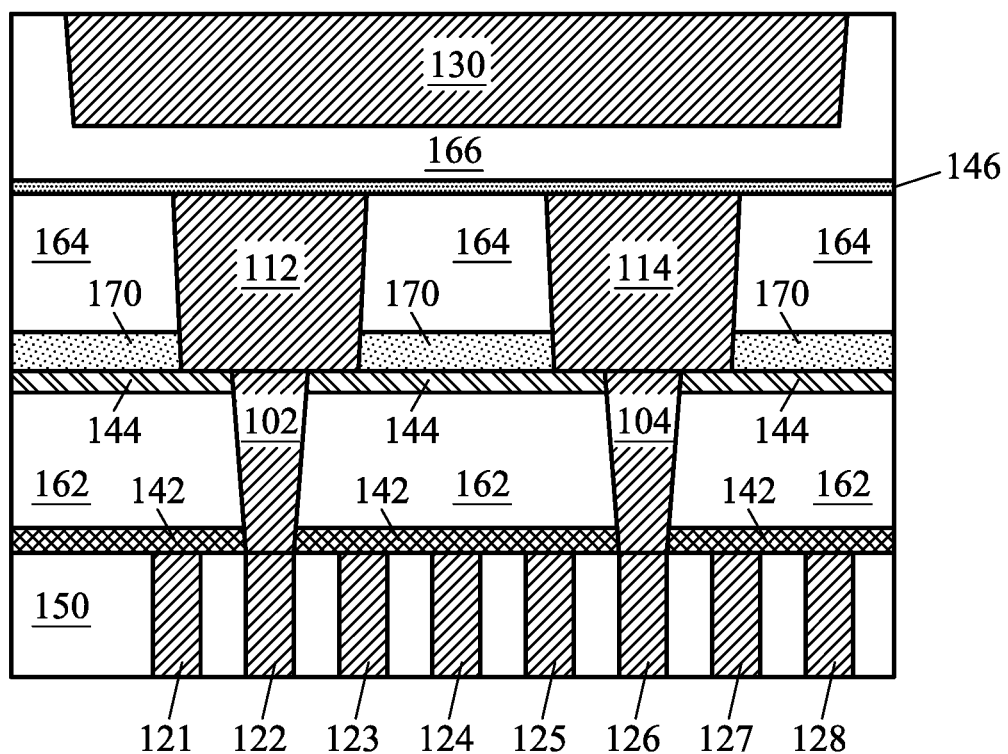

At an act 307, the opening is filled with conductive material (FIG. 3H). As illustrated in FIG. 3H, conductive material used to form via 102 and trench 112 is formed within the first opening 802, and conductive material used to form via 104 and trench 114 is formed within the second opening 804. In some embodiments, the first opening 802 and the second opening 804 are filled using a dual damascene process, however other suitable processes including single damascene processes are also contemplated. It will be appreciated that barrier layers, seed layers, and other materials and layers can be used in act 307 to facilitate the formation of via 102, trench 112, via 104, and trench 114. Moreover, as shown in FIG. 3H, mask layer 352 and buffer layer 344 are removed, and the third etch stop layer 146 is formed over inter-metal dielectric 164, trench 112, and trench 114. Also, inter-metal dielectric 166 is formed over the third etch stop layer 146, and conductive filling 130 is formed over inter-metal dielectric 166. After act 307, formation of interconnect structure 100 is generally completed.

Figure 4A:
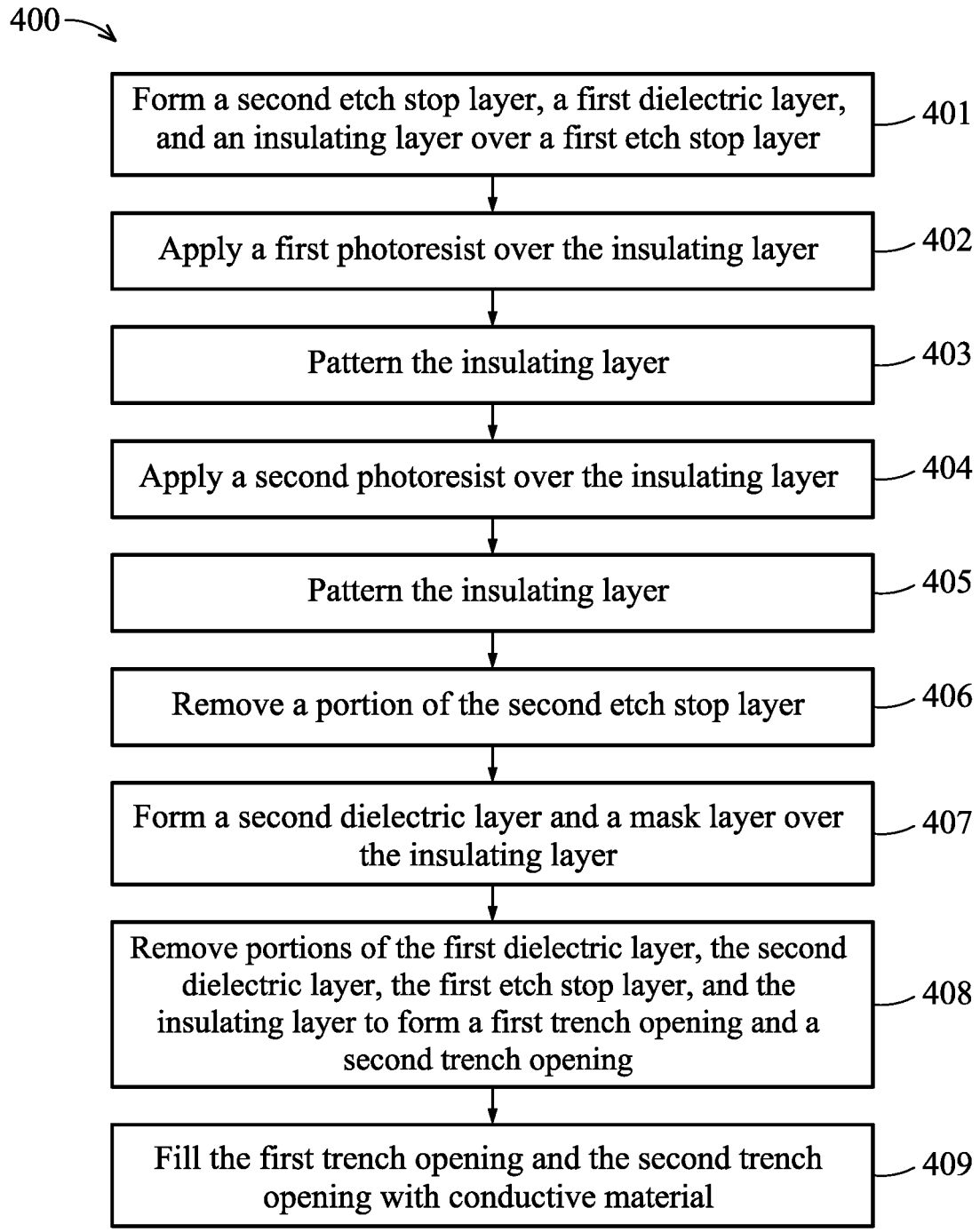
FIG. 4A is a flow diagram illustrating another example process for fabricating the interconnect structure of FIG. 1, in accordance with some embodiments.

FIG. 4A is a flow diagram illustrating another example process 400 for fabricating interconnect structure 100. FIGS. 4B-4J illustrate cross sections of interconnect structure 100 at each act of process 400. In process 400, openings for via 102 and via 104 are patterned into the second etch stop layer 144 before forming the openings for filling with the conductive material that ultimately forms via 102 and via 104, along with trench 112 and trench 114. Additionally, unlike process 300, two separate photoresists are used in patterning the openings for via 102 and via 104 into the second etch stop layer 144. The use of separate photoresists can provide flexibility in the fabrication process such that different via profiles can be formed. The use of separate photoresists can further provide improved precision, especially in applications where feature size is small.

Figure 4B:
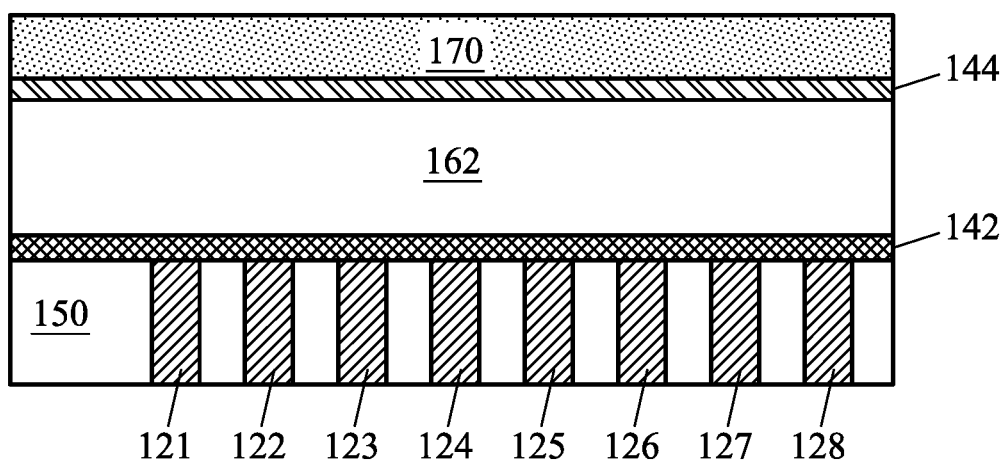
FIGS. 4B-4J illustrate cross sections of the interconnect structure of FIG. 1 at various acts of the process of FIG. 4A, in accordance with some embodiments.

At an act 401, (FIG. 4B). As illustrated in FIG. 4B, inter-metal dielectric 162 is formed over the first etch stop layer 142, the second etch stop layer 144 is formed over inter-metal dielectric 162, and insulating layer 170 is formed over the second etch stop layer 144. Inter-metal dielectric 162 can be formed over the first etch stop layer 142 using various suitable processes, including chemical vapor deposition, physical vapor deposition, atomic layer deposition, and other suitable processes and combinations thereof. The second etch stop layer 144 can be formed over inter-metal dielectric 162 using various suitable processes, likewise including chemical vapor deposition, physical vapor deposition, atomic layer deposition, and other suitable processes and combinations thereof. Insulating layer 170 can be formed over the second etch stop layer 144 using various suitable processes, also including chemical vapor deposition, physical vapor deposition, atomic layer deposition, and other suitable processes and combinations thereof.

Figure 4C:
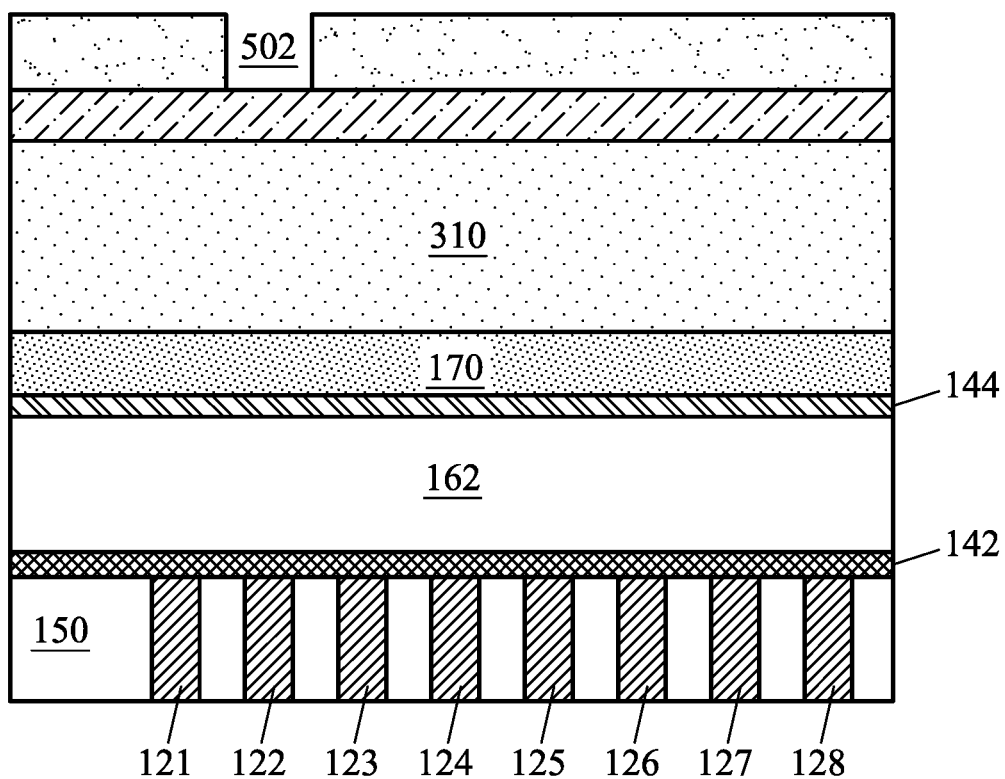

At an act 402, a first photoresist is applied over the insulating layer (FIG. 4C). As illustrated in FIG. 4C, photoresist 310 is applied over insulating layer 170. Also shown in FIG. 4C, opening 502 is formed over photoresist 310 in act 402, but not opening 504. Before applying photoresist 310 in act 402, various protective layers can be applied over insulating layer 170, such as a bottom anti-reflective coating layer. Polishing acts and other preparation acts may also be performed. Photoresist 310 can be applied over insulating layer 170 using various suitable processes, including spin coating and other suitable processes and combinations thereof. Opening 502 can then be aligned with a photomask such that exposure to ultraviolet light during a photolithography process ultimately facilitates formation of a via opening in insulating layer 170 in strategic locations for placement of via 102, as discussed further below.

Figure 4D:
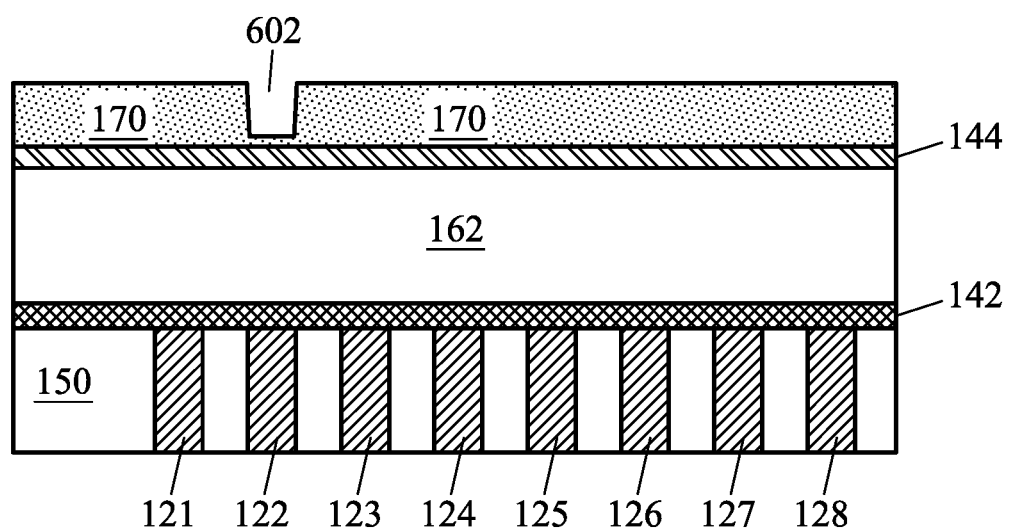

At an act 403, the insulating layer is patterned (FIG. 4D). As illustrated in FIG. 4D, insulating layer 170 is patterned to form opening 602. Opening 602 is formed in accordance with the photolithography performed in act 402 with respect to opening 502. In act 403, opening 602 is patterned in accordance with a desired profile for via 102. The patterning in act 403 can be performed using various suitable processes, including both dry etching and wet etching processes. The second etch stop layer 144 can help facilitate the patterning of insulating layer 170 in act 403. Depending on the intended application, the patterning performed in act 403 can be adapted to accommodate different profiles.

Figure 4E:
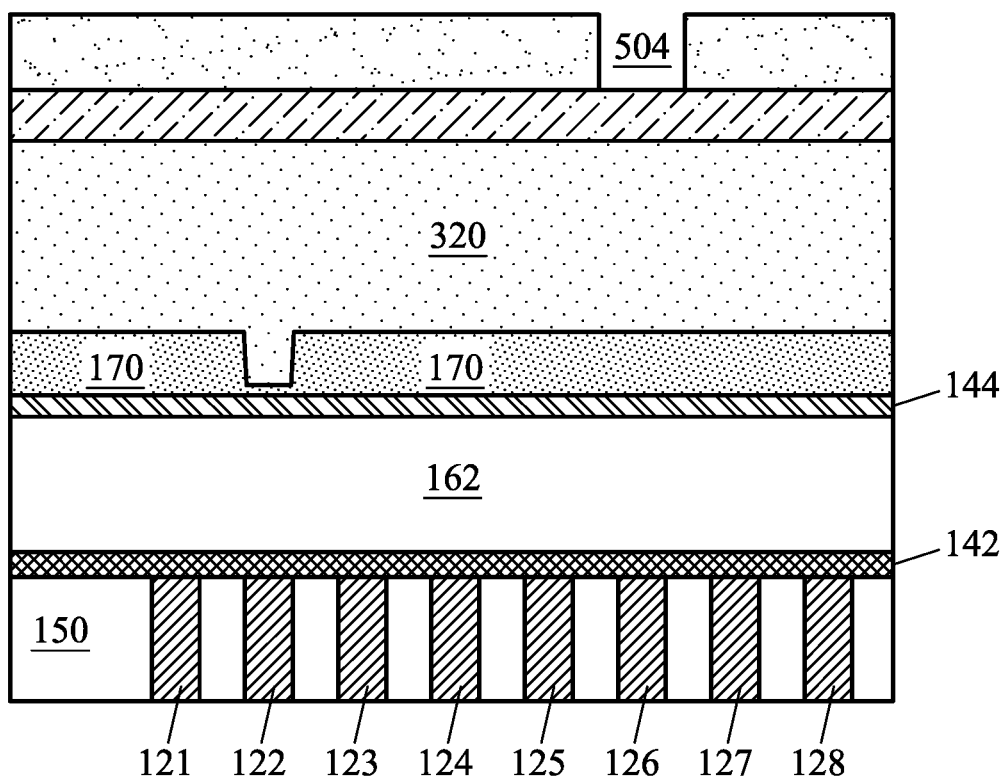

At an act 404, a second photoresist is applied over the insulating layer (FIG. 4E). As illustrated in FIG. 4E, photoresist 320 is applied over insulating layer 170. Also shown in FIG. 4E, opening 504 is formed over photoresist 320. Before applying photoresist 320 in act 404, various protective layers can be applied over insulating layer 170, such as a bottom anti-reflective coating layer. Polishing acts and other preparation acts may also be performed. Photoresist 320 can be applied over insulating layer 170 using various suitable processes, including spin coating and other suitable processes and combinations thereof. Opening 504 can then be aligned with a photomask such that exposure to ultraviolet light during a photolithography process ultimately facilitates formation of via opening in insulating layer 170 in strategic locations for placement of via 102, as discussed further below.

Figure 4F:
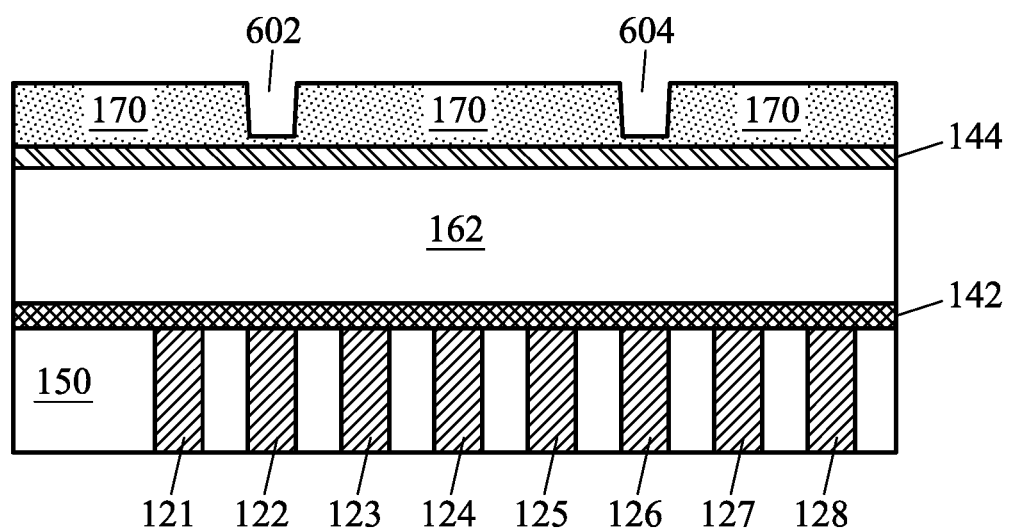

At an act 405, the insulating layer is patterned (FIG. 4F). As illustrated in FIG. 4F, insulating layer 170 is patterned to form opening 604. Opening 604 is formed in accordance with the photolithography performed in act 402 with respect to opening 504. In act 405, opening 604 is patterned in accordance with a desired profile for via 104. The patterning in act 405 can be performed using various suitable processes, including both dry etching and wet etching processes. The second etch stop layer 144 can help facilitate the patterning of insulating layer 170 in act 405. Depending on the intended application, the patterning performed in act 405 can be adapted to accommodate different profiles. For example, in some applications a larger width of opening 604 may be desired, whereas in other applications a narrower width of opening 604 may be desired.

In act 405, various etchants can be used to pattern insulating layer 170, including fluorocarbon-based etchants used at a flow rate ranging from 20 standard cubic centimeters per minute to 50 standard cubic centimeters per minute, nitrogen-based etchants used at a flow rate ranging from 0 standard cubic centimeters per minute to 100 standard cubic centimeters per minute, oxygen based etchants used at a flow rate ranging from 0 standard cubic centimeters per minute to 25 standard cubic centimeters per minute, argon-based etchants used at a flow rate ranging from 600 standard cubic centimeters per minute to 1,200 standard cubic centimeters per minute, hydrogen-based etchants used at a flow rate ranging from 0 standard cubic centimeters per minute to 100 standard cubic centimeters per minute, and hydrofluorocarbon-based etchants used at a flow rate ranging from 0 standard cubic centimeters per minute to 100 standard cubic centimeters per minute. Parameters used in the patterning process can include a either a high radio frequency with a source power ranging from 200 watts to 1000 watts or a low radio frequency with source power ranging from 200 watts to 500 watts. Parameters used in the patterning process can also include a temperature ranging from 0 degrees Celsius to 50 degrees Celsius, a pressure of 20 millitorr to 80 millitorr, a DCS voltage of 0 volts to 500 volts, and a line center and edge trench depth bias of less than 20 angstroms. However, other etchants as well as flow rates, source powers, pressures, temperatures, voltages, and biases outside of the ranges specified above are also contemplated.

Figure 4G:
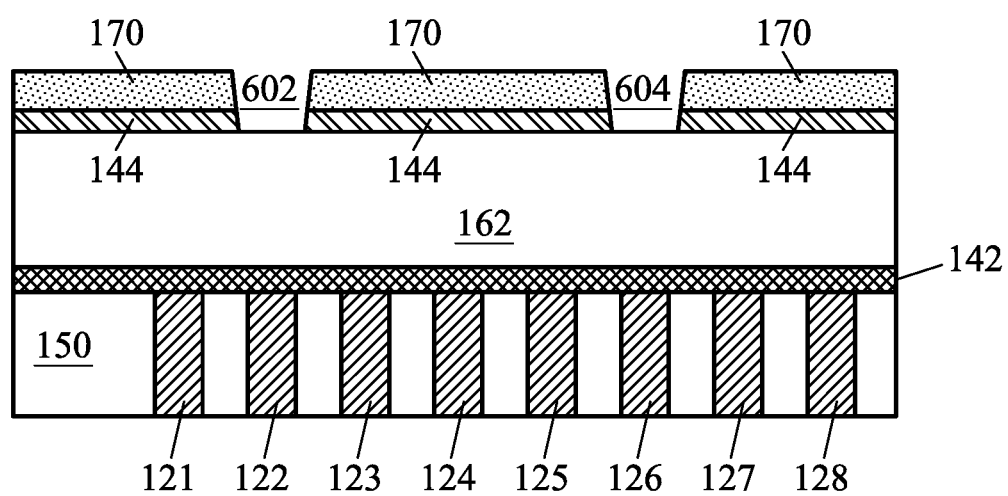

At an act 406, a portion of the second etch stop layer is removed (FIG. 4G). As illustrated in FIG. 4G, both a first portion of the second etch stop layer 144 is removed in accordance with a desired profile for via 102 and a second portion of the second etch stop layer 144 is removed in accordance with a desired profile for via 104. The portion of the second etch stop layer 144 can be removed using various suitable processes, including both wet etching and dry etching processes. In act 406, opening 602 is extended through the second etch stop layer 144 to form an opening for forming via 102, and opening 604 is also extended through the second etch stop layer 144. The extension of opening 602 and opening 604 through the second etch stop layer 144 in act 406, which notably occurs before opening of trench 802 and trench 804 as discussed below, can provide improvements in terms of via faceting integrity, especially as critical dimension sizes in semiconductor devices and integrated circuits continues to decrease.

Figure 4H:
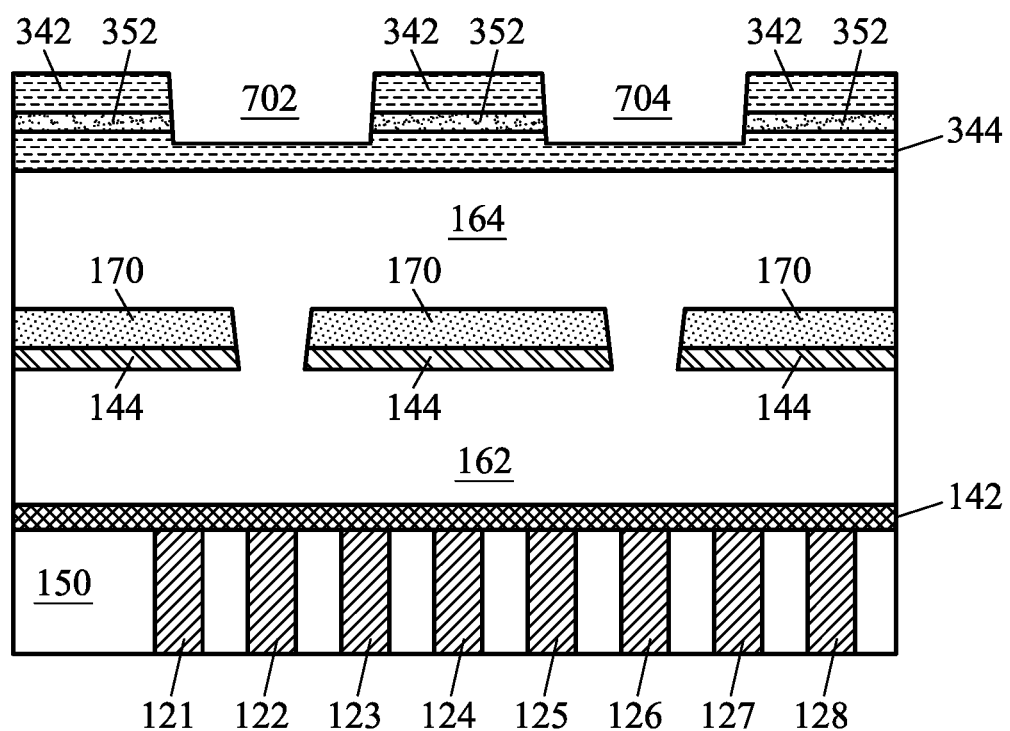
Figure 4I:
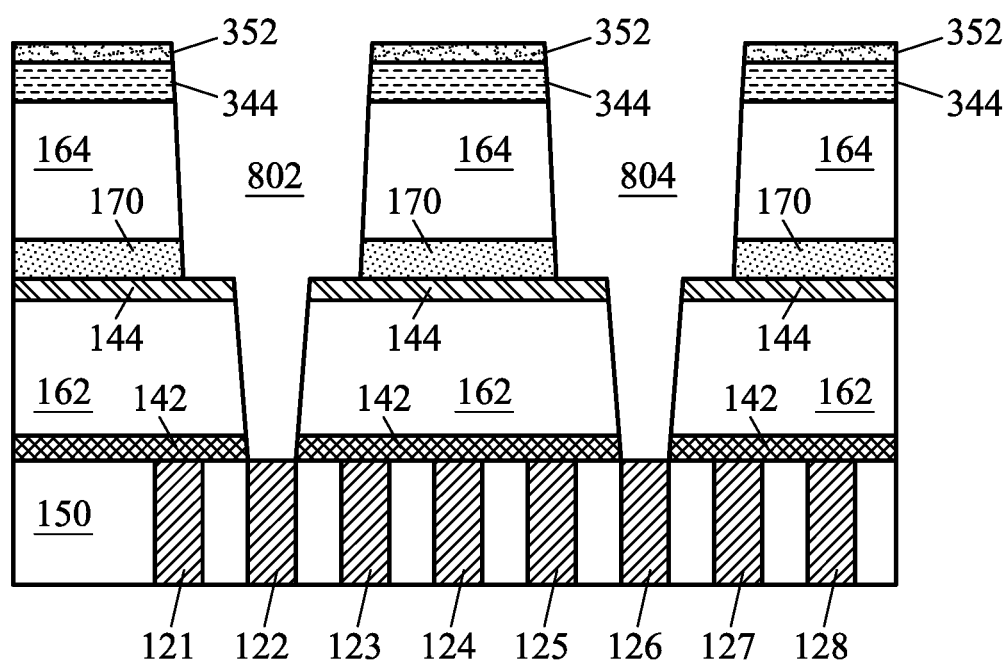

At an act 407, a second dielectric layer and a mask layer are formed over the insulating layer (FIG. 4H). As illustrated in FIG. 4H, inter-metal dielectric 164 is formed over insulating layer 170 and within opening 602 and opening 604. Additionally, mask layer 352 is formed over inter-metal dielectric 164 and between a buffer layer 342 and a buffer layer 344. Mask layer 352 is patterned such that both an opening 702 and an opening 704 are formed within mask layer 352. Mask layer 352 serves as an etching mask during act 306, discusses below, to facilitate formation of trenches that ultimately are filled to form via 102, trench 112, via 104, and via 114. Mask layer 352 in addition to inter-metal dielectric 164, buffer layer 342, and buffer layer 344 can be formed over insulating layer 170 using a variety of suitable processes, including chemical vapor deposition, physical vapor deposition, atomic layer deposition, and other suitable processes and combinations thereof.

At an act 408, portions of the first dielectric layer, the second dielectric layer, the first etch stop layer, and the insulating layer are removed to form both a first opening and a second opening (FIG. 4I). As illustrated in FIG. 4I, portions of inter-metal dielectric 162, inter-metal dielectric 164, the first etch stop layer 142, and insulating layer 170 are removed to from the first opening 802 and the second opening 804. Removing the portion of the first etch stop layer 142 as illustrated in FIG. 4I provided access to conductive line 122. Both the first opening 802 and the second opening 804 can be created using a variety of suitable removal processes and combinations thereof, including various linear removal processes, wet etching processes, dry etching processes, and the like. Because the first opening 802 and the second opening 804 are created after the via profile is formed in act 406, improvements in terms of via faceting integrity can be achieved. In act 408, buffer layer 342 can also be removed.

Figure 4J:
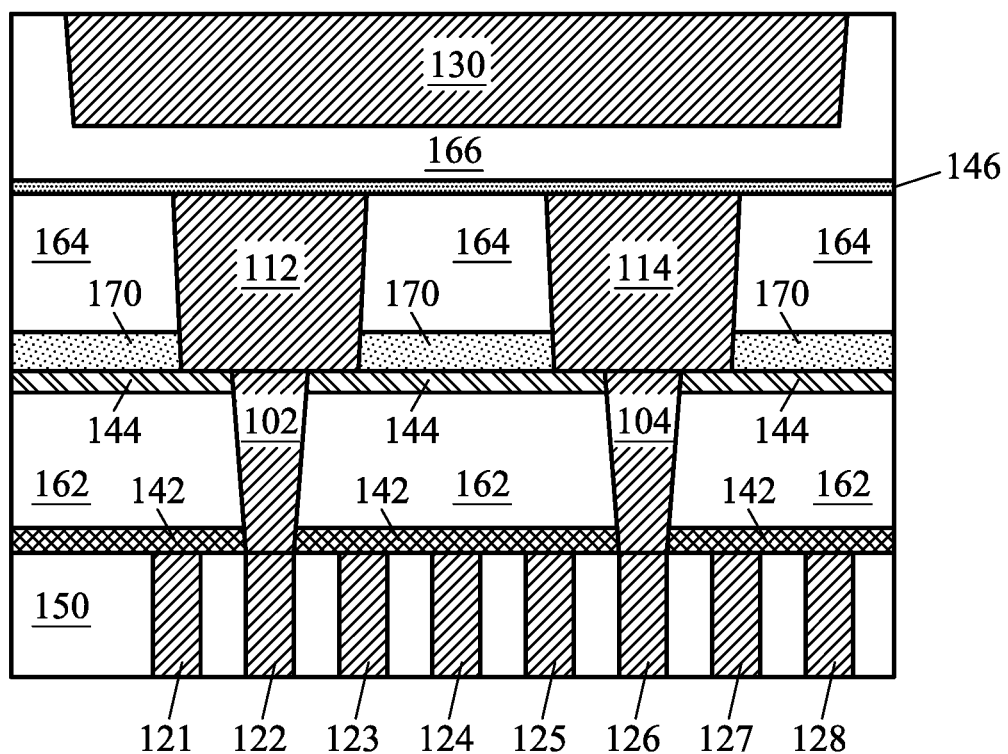

At an act 409, the first opening and the second opening are filled with conductive material (FIG. 4J). As illustrated in FIG. 4J, conductive material used to form via 102 and trench 112 is formed within the first opening 802, and conductive material used to form via 104 and trench 114 is formed within the second opening 804. In some embodiments, the first opening 802 and the second opening 804 are filled using a dual damascene process, however other suitable processes including single damascene processes are also contemplated. It will be appreciated that barrier layers, seed layers, and other materials and layers can be used in act 409 to facilitate the formation of via 102, trench 112, via 104, and trench 114. Moreover, as shown in FIG. 4J, mask layer 352 and buffer layer 344 are removed, and the third etch stop layer 146 is formed over inter-metal dielectric 164, trench 112, and trench 114. Also, inter-metal dielectric 166 is formed over the third etch stop layer 146, and conductive filling 130 is formed over inter-metal dielectric 166. After act 409, formation of interconnect structure 100 is generally completed.

It will be appreciated that process 300 and process 400 as described above are provided as example implementations, and various modification to these processes to improve via faceting integrity are also contemplated within the scope of the present disclosure. For example, depending on the intended application, more than two vias can be formed within an interconnect structure. Moreover, it will be appreciated that interconnect structure 100 generally provides a portion of a full interconnect structure in an integrated circuit or other type of circuit to facilitate understanding of the structures and techniques described herein to those skilled in the art.

As described in detail above, the present disclosure provides an interconnect structure for facilitating electrical connections with semiconductor devices in an integrated circuit. The interconnect structure includes an added etch stop layer formed around a junction of a via and a trench of the interconnect structure. The added etch stop layer serves as a hard mask that can be patterned before removing significant portions of dielectric material for filling with conductive material. The interconnect structure can provide improvements in terms of via faceting control, especially when used with semiconductor devices having continually smaller critical dimension sizes. As critical dimension sizes continue to decrease, challenges including loss of mask material, constrained process windows, and inconsistencies in via profiles may arise.

An implementation of the present disclosure is a semiconductor structure. The semiconductor structure includes a conductive line electrically coupled to an active semiconductor device, a first etch stop layer formed over the conductive line, a first dielectric layer formed over the first etch stop layer, a second etch stop layer formed over the first dielectric layer, a second dielectric layer formed over the second etch stop layer, and an interconnect structure electrically coupled to the conductive line and extending through the first etch stop layer, the first dielectric layer, the second etch stop layer, and the second dielectric layer. The interconnect structure includes a via extending through the first etch stop layer, the second etch stop layer, and the first dielectric layer and a trench extending through the second dielectric layer.

Another implementation of the present disclosure is a method of fabricating a semiconductor structure. The method includes forming a first etch stop layer over a conductive line that is electrically coupled to an active semiconductor device, forming a first dielectric layer over the first etch stop layer, forming a second etch stop layer over the first dielectric layer, removing a portion of the second etch stop layer to expose a portion of the first dielectric layer, forming a second dielectric layer over the second etch stop layer and the first dielectric layer, removing a portion of the second dielectric layer, a portion of the first dielectric layer, and a portion of the first etch stop layer to form an opening and expose the conductive line, and filling the opening with conductive material.

Yet another implementation of the present disclosure is another method of fabricating a semiconductor structure. The method includes forming a first etch stop layer over a conductive line that is electrically coupled to an active semiconductor device, forming a first dielectric layer over the first etch stop layer, forming a second etch stop layer over the first dielectric layer, forming an insulating layer over the second etch stop layer, applying a photoresist over the insulating layer, removing a first portion of the insulating layer and a portion of the second etch stop layer to expose a portion of the first dielectric layer, forming a second dielectric layer over the second etch stop layer and the first dielectric layer, removing a portion of the second dielectric layer, a portion of the first dielectric layer, a second portion of the insulating layer, and a portion of the first etch stop layer to form an opening and expose the conductive line, and filling the opening with conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a via in contact with a conductive line and extending through a first etch stop layer, a first inter-metal dielectric layer, and a second etch stop layer, wherein the second etch stop layer is disposed over the first inter-metal dielectric layer, and the first inter-metal dielectric layer is disposed over the first etch stop layer; and
   a trench in contact with the via and extending through an insulating layer and a second inter-metal dielectric layer, wherein the second inter-metal dielectric layer is disposed over the insulating layer which is disposed over the second etch stop layer;
   wherein a junction of the via and the trench is aligned with an interface between the second etch stop layer and the insulating layer.

2. The semiconductor structure of claim 1, wherein the second etch stop layer is disposed around the junction.

3. The semiconductor structure of claim 1, wherein the insulating layer surrounds a lower portion of the trench.

4. The semiconductor structure of claim 1, wherein a width of the via ranges from about 5 nanometers to about 15 nanometers.

5. The semiconductor structure of claim 1, wherein a width of the trench ranges from about 15 nanometers to about 20 nanometers.

6. The semiconductor structure of claim 1, wherein a thickness of the second etch stop layer ranges from about 10 angstroms to about 30 angstroms.

7. The semiconductor structure of claim 1, wherein the via and trench are each formed of copper.

8. The semiconductor structure of claim 1, wherein the first etch stop layer and the second etch stop layer each include at least one of: silicon nitride, silicon oxide, or silicon carbide.

9. The semiconductor structure of claim 1, wherein a width of the trench is greater than a width of the via.

10. A method of fabricating a semiconductor structure, comprising:
    forming an etch stop layer over a first inter-metal dielectric layer;
    forming an insulating layer over the etch stop layer;
    patterning the insulating layer to form a first opening partially extending through the insulating layer;
    extending the first opening to extend through both the insulating layer and the etch stop layer;
    forming a second inter-metal dielectric layer over the patterned insulating layer such that the second inter-metal dielectric layer extends through the first opening;
    forming a second opening through at least the second inter-metal dielectric layer, the insulating layer, the etch stop layer, and the first inter-metal dielectric layer, wherein the second opening exposes a portion of a top surface of the etch stop layer; and
    filling the second opening with a conductive material to form a first via and a first trench.

11. The method of claim 10, wherein the step of forming a second opening comprises removing a portion of the insulating layer.

12. The method of claim 10, wherein the first via is disposed under the first trench.

13. The method of claim 12, wherein a width of the first via is less than a width of the first trench.

14. The method of claim 10, further comprising:
    patterning the insulating layer to form a third opening partially extending through the insulating layer, the third opening laterally spaced from the first opening;
    extending the third opening to extend through both the insulating layer and the etch stop layer;
    forming a fourth opening through at least the second inter-metal dielectric layer, the insulating layer, the etch stop layer, and the first inter-metal dielectric layer, wherein the fourth opening exposes another portion of the top surface of the etch stop layer and is laterally spaced from the second opening; and
    filling the fourth opening with the conductive material to form a second via and a second trench.

15. The method of claim 14, wherein the step of forming the third opening is performed concurrently with the step of forming the first opening, and the step of forming the fourth opening is performed concurrently with the step of forming the second opening.

16. The method of claim 14, wherein the step of forming the third opening is performed subsequently to the step of forming the first opening, and the step of forming the fourth opening is performed concurrently with the step of forming the second opening.

17. The method of claim 14, wherein the second via is disposed under the second trench, and a width of the second via is less than a width of the second trench.

18. The method of claim 14, wherein a junction of the via and the trench is aligned with an interface between the etch stop layer and the insulating layer.

19. A method of fabricating a semiconductor structure, comprising:
- forming an etch stop layer over a first inter-metal dielectric layer;
- forming an insulating layer over the etch stop layer;
- patterning the insulating layer to form a first opening partially extending through the insulating layer;
- extending the first opening to extend through both the insulating layer and the etch stop layer;
- forming a second inter-metal dielectric layer over the patterned insulating layer such that the second inter-metal dielectric layer fills the first opening;
- forming a second opening through at least the second inter-metal dielectric layer, the insulating layer, the etch stop layer, and the first inter-metal dielectric layer, wherein the second opening exposes a portion of a top surface of the etch stop layer; and
- filling the second opening with a conductive material to form a via and a trench, wherein a junction of the via and the trench is aligned with an interface between the etch stop layer and the insulating layer.

20. The method of claim 19, wherein the step of forming a second opening comprises removing a portion of the insulating layer that overlaid the exposed portion of the top surface of the etch stop layer.

* * * * *